United States Patent [19]
Abe

[11] Patent Number: 5,697,795
[45] Date of Patent: Dec. 16, 1997

[54] IC SOCKET

[75] Inventor: Shunji Abe, Yokohama, Japan

[73] Assignee: Yamaichi Electronics Co., Ltd., Tokyo, Japan

[21] Appl. No.: 578,186

[22] Filed: Dec. 29, 1995

[30] Foreign Application Priority Data

Dec. 29, 1994 [JP] Japan .................. 6-339972

[51] Int. Cl.$^6$ .................. H01R 9/09
[52] U.S. Cl. .................. 439/73; 439/266
[58] Field of Search .................. 439/73, 72, 266

[56] References Cited

U.S. PATENT DOCUMENTS

| | | | |
|---|---|---|---|
| 5,161,984 | 11/1992 | Taylor et al. | 439/73 |
| 5,249,972 | 10/1993 | Walker | 439/73 |
| 5,320,550 | 6/1994 | Uratsuji et al. | 439/266 |
| 5,364,284 | 11/1994 | Tohyama et al. | 439/266 |
| 5,395,254 | 3/1995 | Mogi | 439/70 |
| 6,354,206 | 10/1994 | Mori | 439/68 |

FOREIGN PATENT DOCUMENTS 3-289077 12/1991 Japan .

Primary Examiner—Neil Abrams
Assistant Examiner—T. C. Patel
Attorney, Agent, or Firm—Wenderoth, Lind & Ponack

[57] ABSTRACT

An IC socket is provided for obtaining a contact pressure between a contact of a socket body and a lead of an IC package placed on the contact by pressing down an IC package body or the IC lead by an IC presser. The IC socket comprises a cover movably mounted on an upper portion of the socket body for upward and downward movement, and a pressing lever. The pressing lever being axially movably supported for inward end outward movement and pivotally supported for upward and downward movement with respect to the socket body. An external end of the pressing lever is linked to the cover such that the pressing lever can move upwardly and downwardly in response to the vertical upward and downward movement of the cover. An inner end of the pressing lever is moved inwardly and outwardly while moving upwardly and downwardly in response to but in a direction opposite to the upward and downward movement of the external end of the pressing lever, so as to be brought into and out of engagement with an upper surface of the IC lead, thereby exerting a push-down force against or removing the push-down force from the IC body or the IC lead.

4 Claims, 6 Drawing Sheets

IC SOCKET

BACKGROUND OF THE INVENTION

1. Field of the Invention

This invention relates to an socket designed for obtaining a contact pressure between a contact and a lead by a cover movably mounted on an IC socket for upward and downward movement.

2. Brief Description of the Prior Art

In a Japanese Laid-Open Patent Application No. Hei 3-289077, a first pivotal lever is linked to a cover using a first pivotal lever and a second pivotal lever which is linked to the first pivotal lever, so that the first pivotal lever is pivoted in response to the upward and downward movement of the cover. The pivotal movement of the first pivotal lever causes the second pivotal lever to be pivoted forwardly and backwardly so that the second pivotal lever travels between an engaging position and a disengaging position with respect to an upper surface of an IC body. Then, the IC body is lowered by exerting a downwardly directed force of a spring to the engaging portion, so that the IC body is lowered to urge the IC lead against the contact.

The above conventional device has a complicated construction in which a pair of pivotal levers are linked. Thus, the number of the pivot pins and the linking shafts is increased, and timing is difficult to set. Cumulative errors of the shaft portion makes it difficult to transmit a motion with a high precision, thus resulting in poor engagement.

Since the distance between a pressing-down point made by the cover and an engaging point with respect to the IC body is long, errors of the amounts of motion at the respective points are amplified, thereby making the problem of poor engagement more serious.

The present invention has been accomplished in view of the above problems inherent in the prior art.

SUMMARY OF THE INVENTION

It is, therefore, an object of the present invention to provide an IC socket in which a more reliable electrical connection between a contact and an IC lead can be obtained.

Another object of the present invention is to provide an IC socket which is very simple in construction and small in size.

In order to achieve the above objects, there is provided an IC socket for obtaining a contact pressure between a contact of a socket body and a lead of an IC package placed on the contact by pressing down an IC package body or the IC lead by IC presser means. The IC socket comprises a cover movably mounted on an upper portion of the socket body for upward and downward movement, and a pressing lever. The pressing lever is axially movably supported for inward and outward movement and pivotally supported for upward and downward movement with respect to the socket body, an external end of the pressing lever being linked to the cover such that the pressing lever can move upwardly and downwardly in response to the vertical upward and downward movement. An inner end the pressing lever is moved inwardly and outwardly while moving upwardly and downwardly in response to but in a direction opposite to the upward end downward movement of the external end of the pressing lever, so as to be brought into and cut of engagement with an upper surface of the IC lead, thereby exerting a push-down force or removing the push-dawn force from the IC body or the IC lead.

Since the engagement and disengagement with the IC body or lead are accomplished by a single pressing lever which is linked to the cover, the present invention can achieve the object with a very simple construction, Further, since the pin portion for supporting the pressing lever is minimized, the problems of insufficient accuracy and inadequate engagement attributable to play of the pivot portion can effectively be obviated.

Moreover, since the pressing lever is a lever of the seesaw motion type in which the pressing lever is pivoted about the pivot pin, the push-down force or removal of the push-down force applied to the external end of the lever by the cover positively causes a responsive action of the inner end of the lever and as a result, the IC can appropriately be pressed and released from being pressed.

In addition, since the overall cover can be slid backwardly while moving the external end of the pressing lever vertically upwardly and downwardly by the vertical upward and downward movement of the pressing cover, the forward and backward movement of the lever can be controlled with a high precision. Also, the pressing lever can positively be moved away from the IC body or lead by reducing the push-down stroke of the cover as much as possible and significantly retracting the pressing lever.

The novel features which are considered characteristic of this invention are set out in the appended claims. The invention itself, however, together with additional objects and advantages thereof will be best understood from the following detailed description taken in conjunction with the accompanying drawings which illustrate, by way of example only, a preferred embodiment of this invention.

DETAILED DESCRIPTION OF THE EMBODIMENT

Figure 1:
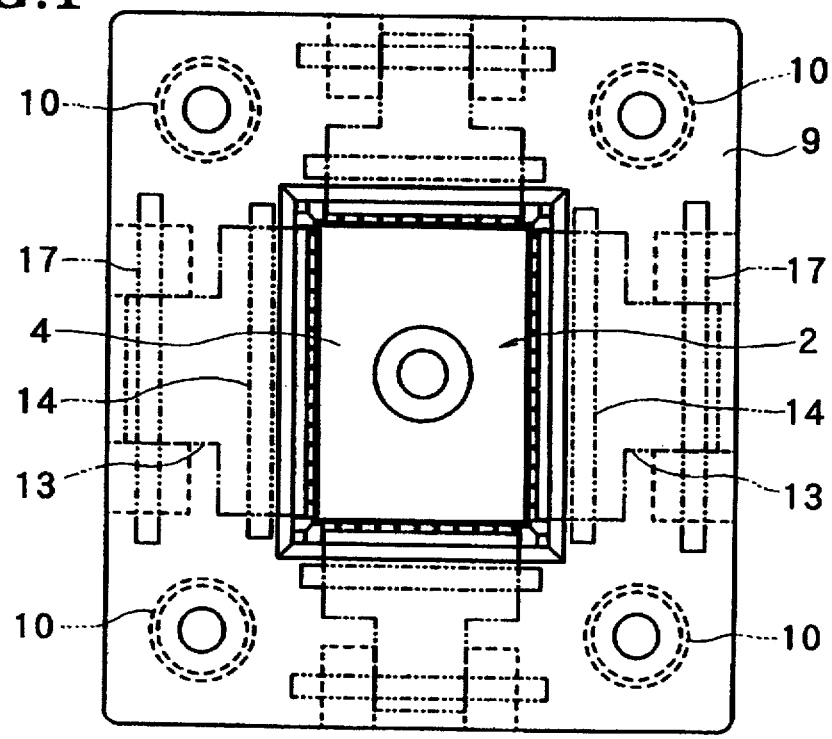
FIG. 1 is a plan view of an IC socket.
Figure 2:
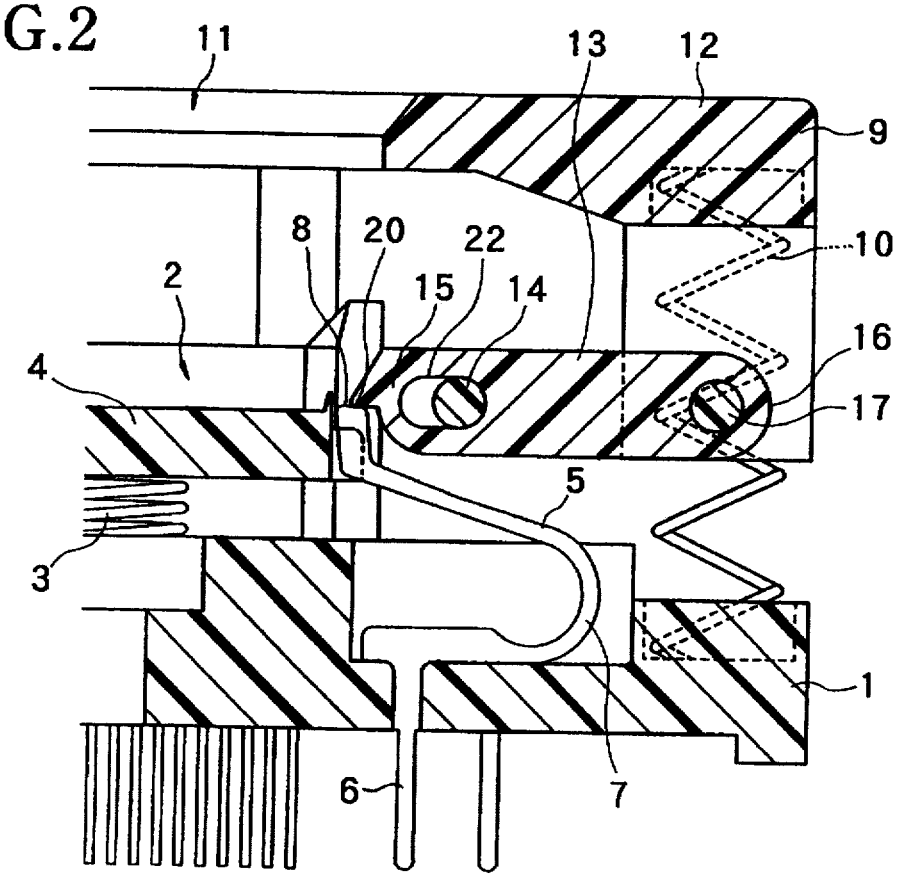
FIG. 2 is a fragmentary sectional view of the IC socket of FIG. 1, showing a normally closed state before an IC package is loaded.

As shown in FIGS. 1 and 2, as well as elsewhere, a socket body 1 has an IC receiving portion 2 which is open at a central portion of an upper surface thereof, and a floating table 4 resiliently movably supported on an inner bottom surface of the IC receiving portion 2 through a spring 3 for movement upwardly and downwardly. The socket body 1 is provided with a plurality of contacts 5 arranged along two or four opposing sides of the floating table 4, i.e., along two or four opposing sides of the IC receiving portion 2.

Depending on the type of IC, the contacts 5 may be arranged along only one side of the IC receiving portion 5. A lower end of each contact 5 is implanted in the socket body 1. The contact 5 includes a male terminal 5 extending downwardly of the socket body 1 from the lower end of the implanted portion of the contact 5 and a spring portion 7 extending from an upper portion of the implanted portion. An upper end of the spring portion 7 is defined as a lead overlie and contact portion 8. A plurality of such lead overlie and contact portions 8 are arranged along each side of the floating table 4.

On the other hand, the socket body 1 is provided on an upper portion thereof with a cover 9. The cover 9 is resiliently held by springs 10 which are interposed between the cover 9 and the socket body 1 at each corner of the socket body 1, for example, such that the cover 9 is pushed upwardly by the resiliency of the springs 10.

The cover 9 has an IC insertion/removal window 11 which is open at en upper position of the IC receiving portion 2. A push-down control portion 12 is formed by a frame wall which defines the IC insertion/removal window 11.

Figure 6:
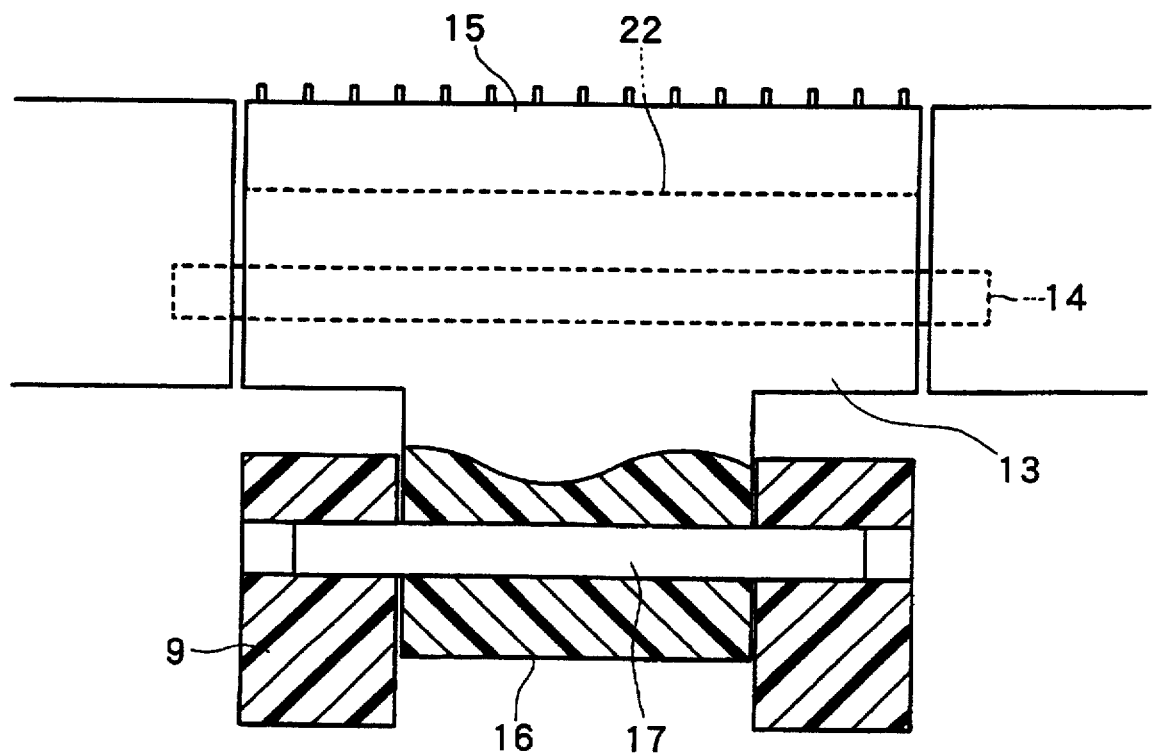
FIG. 6 is a cross-sectional view of a pivotal portion of the presser cover in the above IC socket, showing the state that the pressing lever is pivoted while proceeding forwardly and inwardly.
Figure 7:
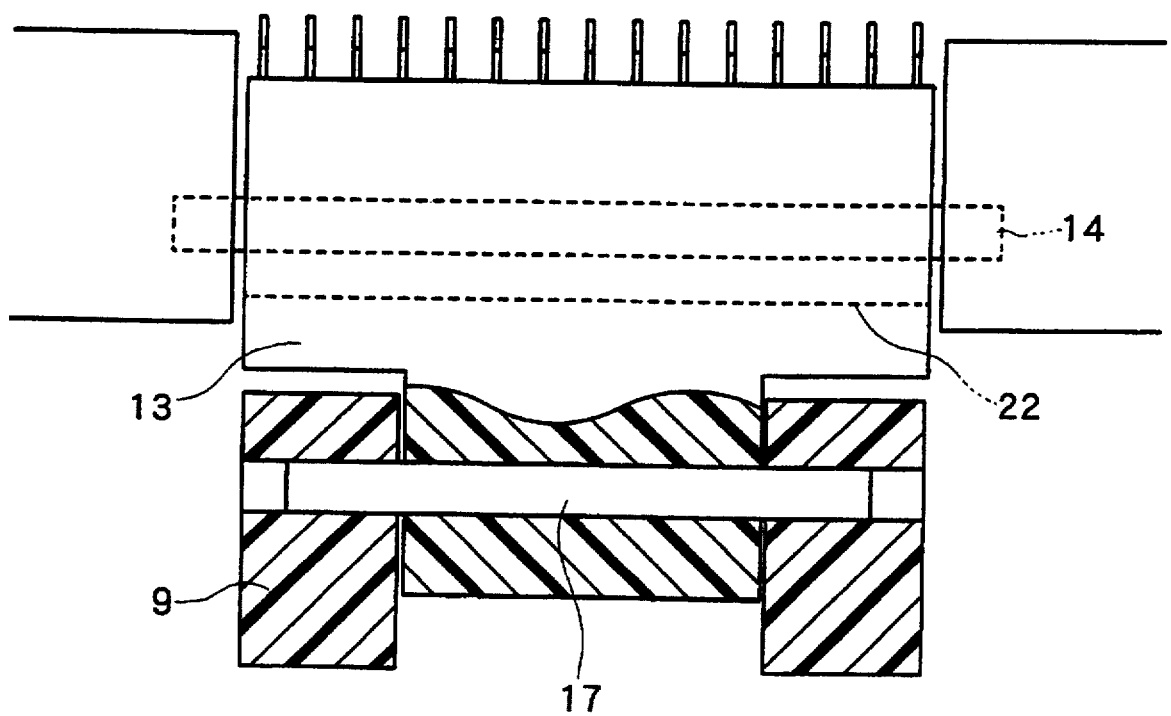
FIG. 7 is an illustration, showing the state that, in the cross-sectional view of FIG. 6, the pressing lever is pivoted while proceeding rearwardly and outwardly in the cross sectional view of FIG. 6.

Pressing levers 13 are disposed, in their horizontal postures, immediately under the frame wall, i.e., push-down control portion 12, of the cover 9. As shown in FIGS. 2, 6 and 7, as well as elsewhere, each pressing lever 13 is pivotally supported at an intermediate (pivot) portion thereof through a support pin 14. The pressing lever 13 has an inner end 15 projecting inwardly from the pivot portion and an external end 16 extending outwardly from the pivot portion by a comparatively long distance. The external end 16 is linked to the frame wall of the cover 9 through a shaft 17. A lead presser 20 is formed on the inner end 15 of the pressing lever 13. The lead presser (or IC presser) 20 is brought into and out of engagement with an upper surface of each IC lead 19. When the lead presser 20 is brought into engagement with the IC lead 19, it pushes down the IC lead 19 against the overlie and contact portion 8 of the contact 5.

The inner end 15 of the pressing lever 13 can be moved into and out of engagement with an edge portion of the upper surface of the IC body 18. When the inner end 15 is brought into engagement with the edge portion of the upper surface of the IC body 18, it pushes down the IC body 18 so that the lead 19 is urged against its corresponding contact 5. At that time, the lead presser 20 acts as a presser of the IC body 18.

The IC package has the leads 19 which are allowed to project sidewardly from side surfaces of the IC body 18. When the IC package is received in the IC receiving portion 2, the IC lead 19 is placed on or proximately faced with the overlie and contact portion 8 of the contact 5.

When the lead presser portion 20 formed on the inner end 15 of the pressing lever 13 is moved downwardly, it pushes down the upper surface of the lead 19 with the overlie and contact portion 8. When the lead presser portion 20 is moved upwardly, it is moved in a slantwise direction upwardly and outwardly away from the upper surface of the lead 19. In that state, the IC package can be inserted and removed.

Figure 5:
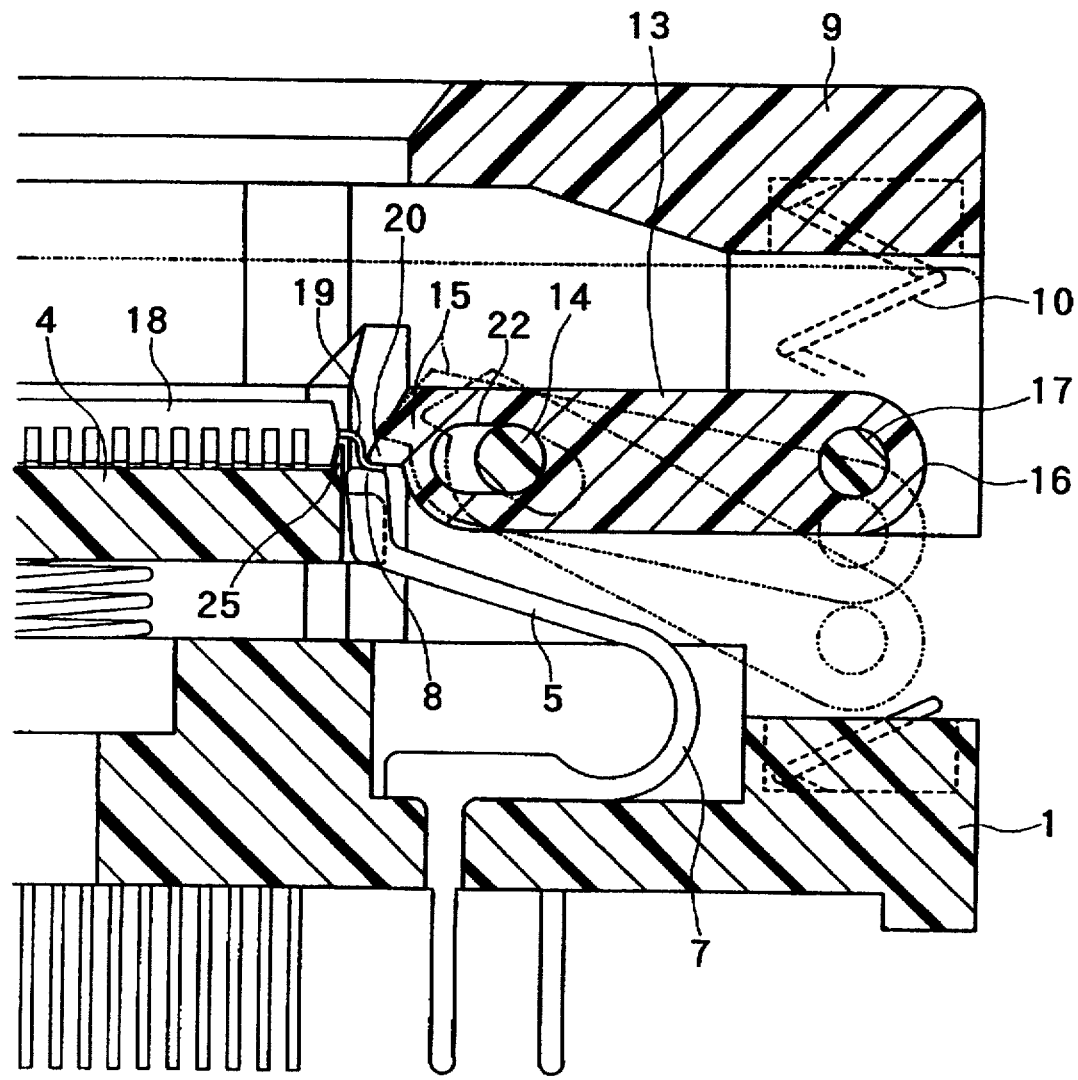
FIG. 5 is a fragmentary sectional view of an IC socket showing the locus of movement of the presser cover when the presser cover is open in the state of FIG. 4.

As shown in FIGS. 5, 6 and 7, as well as elsewhere, the external portion 16 of the pressing lever 13 and the linking portion of the cover 16 are tightly connected through a shaft 17 so that no play is generated. Opposite ends of the pin 14 serving as the pivotal point of the pressing lever 13 are supported by the socket body 1 and the pivot pin 14 is loosely fitted into a guide slot 22, which is comprised of a horizontal elongated hole, formed in the pressing lever 13.

The pressing lever 13 can laterally be moved inwardly and outwardly within a range permitted by the guide slot 22. The pressing lever 13 is moved by a combined motion of the above-mentioned horizontal motion element and the previously-mentioned pivotal motion element.

As shown in FIG. 2, when the cover 9 is held in its raised position by the push-up force of the spring 10, this push-up force of the spring 10 is applied to the linking portion of the cover 9 and thus to the pressing lever 13. As a consequence, the external end 16 of the pressing lever moved upwardly, and the inner end 15 and the lead presser portion 20 are moved downwardly, so that the lead presser portion 20 is urged against the lead overlie and contact portion 8 under the biasing force of the spring 10.

More specifically, the external end 16, i.e., the shaft 17 at the linking portion, of the pressing lever 13 is raised vertically upwardly, while the inner end moved downwardly about the pin 14. During the downward pivotal movement of the inner end 15, the inner end 15 undergoes an inwardly movable component within the range permitted by the guide slot 22. A combination of the downward pivotal movement and the inward movement causes the inner end 15 of the pressing lever 13 to move in a slantwise direction downwardly and inwardly. At that time, the pin 14 is located on the external end side of the guide slot 22.

As mentioned above, the application of the inwardly movable component to the pivotal motion component can reliably bring the lead presser portion 20 of the pressing lever 13 into the lead pressing position.

Figure 3:
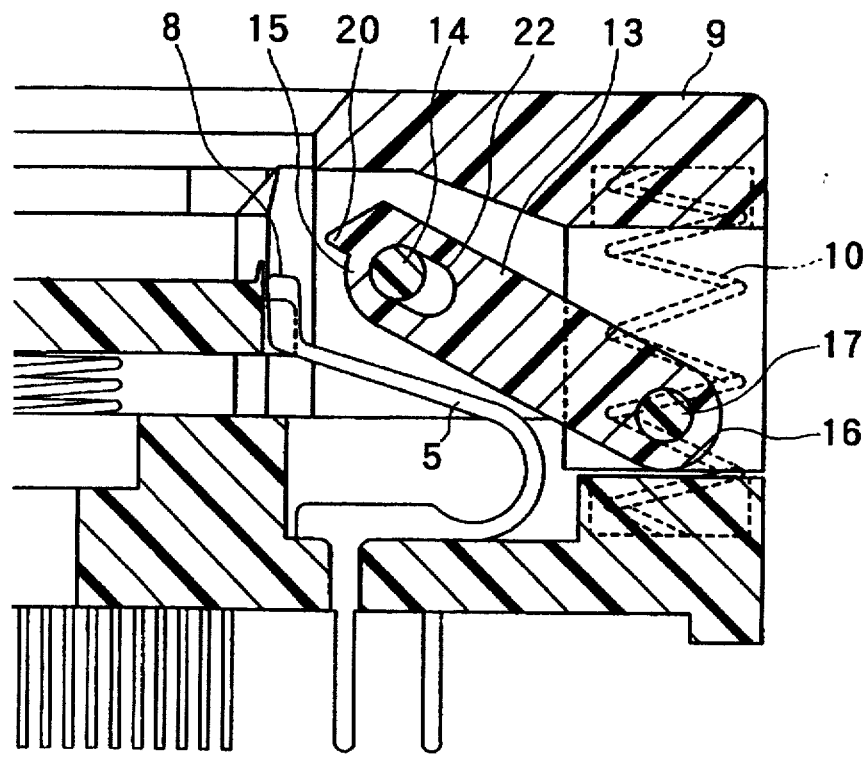
FIG. 3 is likewise a fragmentary sectional view of the IC socket but in which a presser cover is open.
Figure 8:
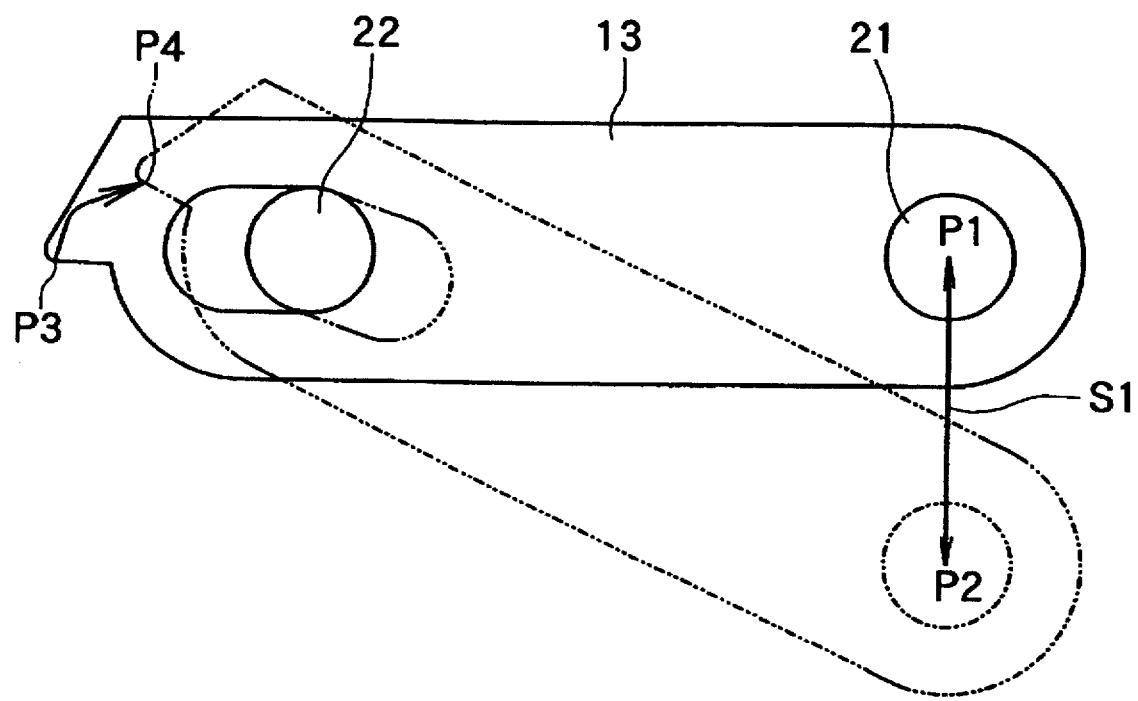
FIG. 8 is an explanatory view for explaining the locus of movement of the external and internal ends of the presser cover.

Next, when the cover 9 is pressed vertically downwardly, as shown in FIGS. 3 and 8, the external end 16 of the pressing lever 13 linked to the cover 9 is moved vertically downwardly with the support shaft 14 serving as a support point. At the same time, the lead presser portion 20 of the inner end 15 is moved upwardly and away from the overlie and contact portion 8 in a slantwise direction upwardly and outwardly.

More specifically, the shaft 17 at the linking portion, i.e., the external end 16 of the pressing lever 13 is moved vertically downwardly, while the inner end of the lever 13 is pivoted upwardly about the pin 14. During the upward pivotal movement of the inner end 15, the inner end 15 undergoes an outward movement component within the range permitted by the guide slot 22. A combination of the upward pivotal movement and the outward movement causes the inner end 15 of the pressing lever 13 to move in a slantwise direction upwardly and outwardly. At that time, the pin 14 is located on the internal end side of the guide slot 22.

As mentioned above, the application of the outward a movement component to the pivotal motion component can reliably bring the lead presser portion 20 of the pressing lever 13 away from the lead 19.

Figure 4:
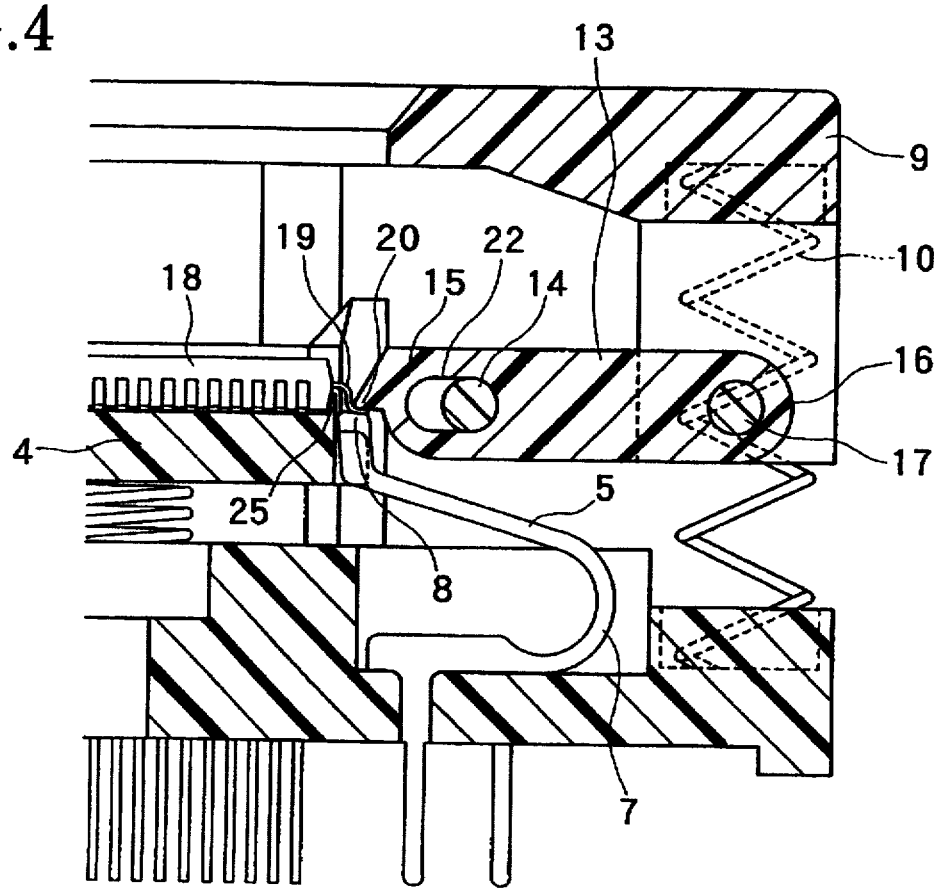
FIG. 4 is a fragmentary sectional view of the IC socket, in which an IC package is loaded on the IC socket in the state of FIG. 3, and then the presser cover is closed to press an IC lead toward its corresponding contact.

After the state of FIG. 3 is realized, as shown in FIG. 4, the IC package is inserted into the IC receiving portion 2 and correctly positioned, with the side surface of the IC body 18 restricted by positioning wall 25 on the peripheral edge portion of the floating table 4 and with the lower surface of the IC lead 19 overlaid and contacted with or located proximate to the upper surface of the overlie and contact portion 8 of the contact 5.

Next, when the push-up force applied to the cover 9 is removed, the cover 9 is pushed upwardly by the resilient restoring force of the spring 10. This upward force of the cover 9 is applied to the linking portion of the cover 9, so that the external end 16 of the presser cover 13 is raised vertically upwardly through the linking shaft 17 and, at the same time, the inner end 15 is moved downwardly with the overall pressing lever 13 being guided by the guide slot 22 and being pushed inwardly.

As a consequence, the lead presser portion 20 of the pressing lever 13 applies an engaging push-down force to the upper surface of the IC lead 19 through a combined motion of the pivotal motion and the lateral motion, so that the IC lead 19 is urged against the lead overlie and contact portion 8 of the contact 5 by this push-down force.

As a result, the lead overlie and contact portion 8 is flexed downwardly against the resiliency of the spring portion 7, and caused to contact, under pressure, the lead 19 by reaction of the spring portion 7. As described above, the present invention includes the case that the inner end of the presser cover 13 is brought into engagement with the edge portion of the upper surface of the IC body 18.

As shown by phantom lines in FIG. 5, in the state of FIG. 5, when the cover 9 is lowered again, the lead presser portion 20 of the pressing lever 13 is moved upwardly and away from the IC to remove the electrical connection between the contact and the lead as described with reference to FIG. 3.

As described above, the single pressing lever is used and this lever is operatively connected to the upward and downward movement of the cover, so that the IC lead is pressed and released from being pressed.

As shown in FIG. 8, the external end, i.e., linking shaft 17, of the pressing lever 13 is vertically moved between points $P_1$ and $P_2$ along the locus $S_1$, whereas the lead presser portion 20 of the inner end 15 of the pressing lever 13 is pivotally moved in a slantwise direction upwardly and outwardly or in a slantwise in a direction downwardly and inwardly along the locus $S_2$.

The pressing lever 13 is supported by the linking shaft 17 at a fixed support point with respect to the cover 9 and supported by the socket body 1 through the pivot pin 14.

In that case, an arrangement is possible that the guide slot 22 is formed in the socket body 1 and the pivot pin 14 is provided on the pressing lever 13.

As shown in FIG. 1, the pressing lever 13 is disposed along the edge portion of each opposing side of the IC receiving portion, so that the pressing levers 13 are placed opposite the contacts 5 which are arranged along the four sides, two sides or one side of the IC receiving portion.

The pressing lever is integrally formed of an insulative material or formed of a metal material, and the pressing surface of the lead presser portion 20 is attached with an insulative material.

The present invention can form a structure for obtaining a contact pressure by urging the IC lead against its corresponding contact utilizing the single pressing cover which is linked to the cover. Thus, the present invention can achieve its object by remarkably simplifying the construction of the IC socket compared with the construction of the conventional double link structure.

Further, since the present invention employs the single pressing lever system, the pivot point is minimized so that errors caused by play of the number of pivot points can be reduced as much as possible. Owing to this arrangement, the pressing lever can reliably be moved into and out of engagement with the upper surface of the IC body or IC lead.

Moreover, the distance between the press-down point of the pressing lever by the cover and the engaging points with respect to the IC body or IC lead are extensively reduced, so that motion errors of the opposite ends of the pressing lever can be minimized.

Furthermore, since the pressing lever is a lever of the seesaw motion type in which the pressing lever is pivoted about the pivot pin, the vertical push-down force or removal of the push-down force applied to the external end of the lever by the cover positively causes a responsive action of the inner end of the lever. Thus, the IC can appropriately be pressed and released from being pressed. Further, since the pressing lever is operatively connected to the cover such that the overall pressing lever is slid outwardly, the pressing lever can be retracted by a relatively large distance with a least possible press-down stroke of the cover, so that the lever can reliably be moved away from the IC body or lead.

In addition, since the external end of the pressing lever is axially supported with no play with respect to the cover, the forward and backward stroke of the lever can be obtained with a high degree of precision.

Although this invention has been described in its preferred form with a certain degree of particularity, it is understood that the present disclosure of the preferred form has been made only by way of example and that numerous changes in the details of construction and arrangement of parts may be resorted to without departing from the spirit and the scope of the invention as hereinafter claimed.

What is claimed is:

1. An IC socket for receiving an IC package, said IC socket comprising:

a socket body including an IC receiving portion and contacts, respectively having contact portions, disposed about said IC receiving portion;

a cover movably mounted to said socket body for movement downwardly toward and upwardly away therefrom;

a presser lever having an inner end and an outer end, said inner end of said presser lever being non-movably attached to said outer end of said presser lever;

wherein said inner end of said presser lever includes an IC presser portion and is pivotally and slidably mounted, by a pivot pin-and-slot connection, to said socket body; and wherein said outer end of said presser lever is pivotally mounted, by a pivot shaft, to said cover for movement therewith relative to said socket body such that, upon movement of said cover downwardly toward said socket body, said outer end of said presser lever is moved downwardly and pivots about an axis fixed relative to said cover and said inner end of said presser lever is pivoted upwardly about said pivot pin-and-slot connection and moved outwardly away from said contact portions of said contacts and said IC receiving portion of said socket body.

2. An IC socket as recited in claim 1, wherein said pivot shaft is secured for movement with said cover such that, upon upward and downward vertical movement of said cover relative to said socket body, said shaft and said outer end of said presser lever are moved vertically and are prevented from moving in inward and outward directions relative to said socket body.

3. An IC socket as recited in claim 1, further comprising a spring for biasing said IC presser portion of said presser lever against said contact portions of said contacts.

4. An IC socket as recited in claim 1, further comprising a spring interposed between said socket body and said cover and urging said cover, and said outer end of said presser lever, upwardly.

* * * * *